United States Patent [19]

Yasuda et al.

[11] 4,228,455

[45] Oct. 14, 1980

[54] GALLIUM PHOSPHIDE SEMICONDUCTOR DEVICE HAVING IMPROVED ELECTRODES

[75] Inventors: Nobuaki Yasuda, Zushi; Takenobu Ogawa, Kawasaki; Tetsuo Sadamasa, Tokyo, all of Japan

[73] Assignee: Tokyo Shibaura Denki Kabushiki Kaisha, Kawasaki, Japan

[21] Appl. No.: 937,786

[22] Filed: Aug. 29, 1978

[30] Foreign Application Priority Data

Sep. 5, 1977 [JP] Japan .................. 52-105770

[51] Int. Cl.³ .............. H01L 23/48; H01L 29/46; H01L 29/62
[52] U.S. Cl. .............. 357/67; 357/17; 357/65
[58] Field of Search .............. 357/17, 67, 65

[56] References Cited

U.S. PATENT DOCUMENTS

| Re. 27,879 | 1/1974 | Collins et al. | 357/67 |
| 3,532,562 | 10/1970 | Clawson et al. | 357/67 |
| 3,728,785 | 4/1973 | Schmidt | 357/67 |
| 3,729,807 | 5/1973 | Fujiwara | 357/67 |
| 3,871,016 | 3/1975 | Debesis | 357/67 |

FOREIGN PATENT DOCUMENTS 2324123  4/1977  France .................. 357/67

Primary Examiner—Andrew J. James
Attorney, Agent, or Firm—Oblon, Fisher, Spivak, McClelland & Maier

[57] ABSTRACT

A gallium phosphide semiconductor device comprising an N type gallium phosphide monocrystal, a semiconductor layer formed in or on the monocrystal, and a pair of electrodes formed on the monocrystal and on the semiconductor layer. The electrode on the monocrystal is made of a gold-germanium alloy having a predetermined germanium content.

10 Claims, 3 Drawing Figures

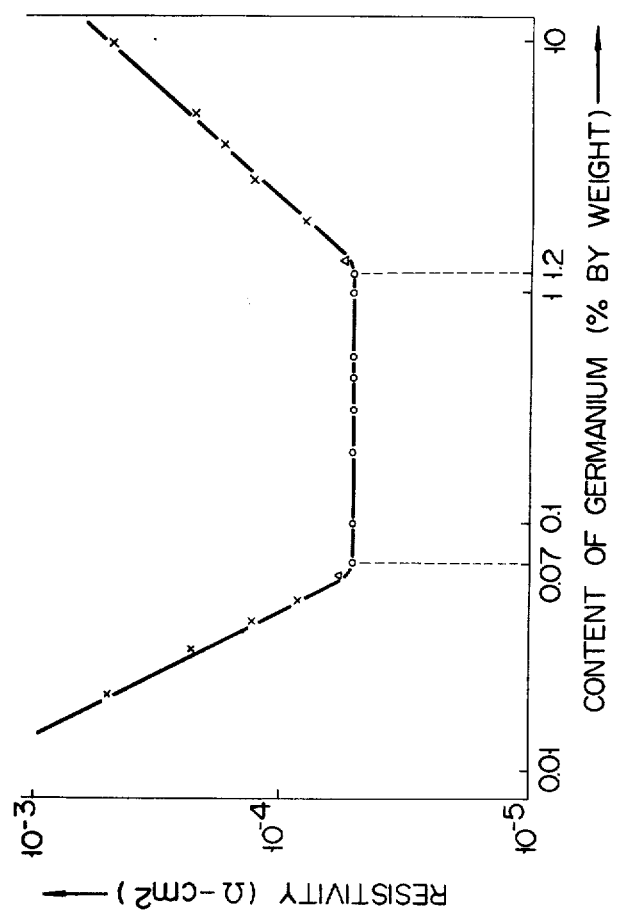

GALLIUM PHOSPHIDE SEMICONDUCTOR DEVICE HAVING IMPROVED ELECTRODES

BACKGROUND OF THE INVENTION

I. Field of the Invention

This invention relates to a semiconductor device, and more particularly to a gallium phosphide semiconductor device having improved electrodes.

II. Description of the Prior Art

Various semiconductor devices based on compound semiconductive materials are known. Among them are light emitting diodes, semiconductor lasers and microwave elements such as Gunn diodes. The most popular device of these is a light emitting diode the substrate of which is made of gallium phosphide (GaP) monocrystal. This light emitting diode is used as a display element for watches and a display element for meters for automobile and industrial use.

A monocrystal semiconductor alone cannot perform any useful operation. It does not work as a semiconductor device unless it is provided with electrodes as well as a semiconductor layer and supplied with drive energy through the electrodes. A GaP light emitting diode, for example, comprises an N type GaP monocrystal substrate, an N type layer epitaxially grown on the substrate, a P type layer also epitaxially grown on the N type layer, and a pair of electrodes formed on the P type layer and on the exposed surface of the substrate, respectively. Generally, a voltage is applied between the electrodes thereby to make the PN junction emit light.

Material of the electrodes of such a GaP light emitting diode must satisfy various requirements. First, it must form a good ohmic contact with a compound semiconductor crystal (e.g. GaP crystal). Second, it can be well bonded to lead wires. Third, it can be formed in a fine pattern. Further, it must be heatresistive and durable at 500° C. or more. Still further, it must be strong against chemicals, particularly acids. Moreover, it can be shaped in the form of a film and prepared in a large quantity.

Generally, electrodes formed on an N type GaP substrate are made of a 2%Si-98% Au alloy film. This Si-Au alloy satisfies almost all the above-mentioned requirements. But it cannot be prepared in a sufficiently large quantity. In addition, an interface between this Si-Au alloy and the substrate becomes black at a heat treatment. Therefore, if provided with electrodes made of such a Si-Au alloy, a light emitting semiconductor device would inevitably have its light emitting efficiency reduced.

SUMMARY OF THE INVENTION

An object of this invention is to provide a gallium phosphide semiconductor device having improved electrodes.

According to this invention a gallium phosphide semiconductor device is provided which comprises an N type gallium phosphide monocrystal, a semiconductor layer formed in or on the monocrystal, and a pair of electrodes forming an ohmie contact and formed on a surface of the monocrystal and on a surface of the semiconductor layer. The electrode on the monocrystal surface is made of a film of a gold-germanium alloy which contains germanium in a concentration ranging from the upper limit at which germanium forms a solid solution with gold at room temperature to the upper limit at which germanium forms a solid solution with gold at the eutectic temperature of the alloy.

The inventors of this invention have studied various materials to form electrodes on an N type GaP substrate and have found that gold-germanium alloys help provide better light-emitting devices than do the silicon-gold alloys hitherto used. The gold-germanium eutectic alloy (12%Ge-88% Au) is known as the material of electrode films for Gunn diodes and the like which are based on gallium arsenide monocrystal. Such a gold-germanium alloy film, however, should turn into tiny lumps or beads when heated to 450° C. or more in an attempt to establish an ohmic contact with the substrate. To avoid this, as shown in Japanese Patent Publication No. 42-24853, a film of nickel or other metal into which germanium or gold can hardly melt is laid on a film of gold-germanium eutectic alloy formed on the gallium arsenide substrate, and then the above-mentioned heat treatment is carried out.

In order to see whether or not such a metal film would be necessary in establishing an ohmic contact between a germanium-gold alloy film and an N type gallium phosphide substrate, the inventors have conducted experiments. Their experiments show that films of gold-germanium eutectic alloy, though exhibiting a little different ohmic contact with a gallium phosphide substrate, melt to form tiny lumps when heated at 450° C. or more. Thus a nickel film is indispensable also in providing an ohmic contact between the germanium-gold eutectic alloy film and an N type gallium phosphide substrate.

However, if a metal film such as a nickel film is laid on a gold-germanium alloy film, the electrode forming becomes a rather complicated process, a fine patterning will be difficult, and the producibility, reproducibility and yield of the electrodes will considerably reduced.

Accordingly, the inventors have further studied in detail to see if a germanium-gold alloy film alone can serve as a satisfactory electrode on the N type Gap substrate. They have found at last that a germanium-gold alloy film does not form tiny lumps when heated at 450° C. or more and does yet establish a good ohmic contact with the N type GaP substrate if the germanium content in the alloy is kept within a specific range.

BRIEF DESCRIPTION OF THE DRAWING

FIG. 2 is a graph showing the relationship between the germanium content in a gold-germanium alloy and the contact resistance of the alloy to an N type gallium phosphide substrate.

DETAILED DESCRIPTION OF THE PREFERRED EMBODIMENT

Figure 1:
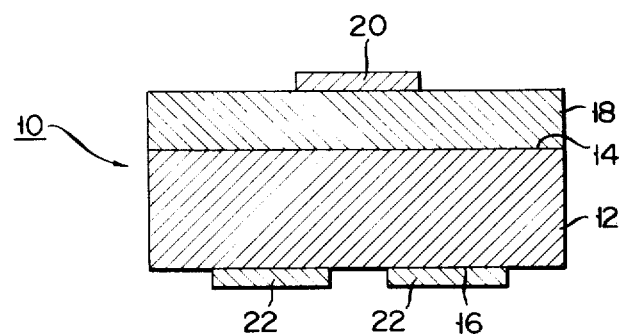
FIG. 1 is a cross sectional view of one gallium phosphide semiconductor device according to this invention.

As shown in FIG. 1, a gallium phosphide semiconductor device 10 according to one embodiment of this invention has a body 12 of N type gallium phosphide monocrystal. The gallium phosphide monocrystal may be produced by the well-known Liquid Encapsulated Czochralski (LEC) method. On one major surface 14 of the substrate 12 a semiconductor layer 18 is formed, which includes a PN junction. The semiconductor layer 18 is made of either a single layer or two layers or more. It may be formed be regrowth method, liquid-phase epitaxial growth method or vapor-phase epitaxial growth method. These methods are selectively used according to the purpose. To manufacture a red light emitting diode, for example, the semiconductor layer 18 consists of two layers, an N type gallium phosphide layer formed directly on the substrate 12 by the liquid-phase epitaxial growth method and a P type gallium phosphide layer formed on the N type layer also by the liquid-phase epitaxial growth method. To manufacture a green light emitting diode, the semiconductor layer 18 is comprised of two layers, an N type gallium phosphide layer formed on the substrate 12 by the regrowth method (i.e. melting and re-solidification of the substrate surface) and a P type gallium phosphide layer formed on the N type layer by the liquid-phase epitaxial growth method.

Instead the semiconductor layer 18 may be comprised of four layers. The first layer is made of gallium arsenide phosphide and formed 30 to 50 μm thick on the body 12 by the vapor-phase epitaxial growth method. This layer has a rising gradient of an arsenic concentration, 0 to x from the substrate toward its surface (i.e., in the direction of its growth). Namely, the first layer is formed of Ga $As_x P_{1-x}$ around its surface. The second layer is made of gallium arsenide phosphide and formed 30 to 50 μm thick on the first layer. The third layer is made of gallium arsenide phosphide, formed 10 to 15 μm thick on the second layer and doped with nitrogen. The fourth layer is made of P type gallium phosphide, formed 5 to 8 μm thick by diffusing zinc into the third layer. The second, third and fourth layers each contain arsenic in a concentration corresponding to the upper arsenic concentration in the first layer or are each formed of Ga $As_x P_{1-x}$. Depending on the arsenic and nitrogen concentrations in the third layer, i.e. Ga $As_x P_{1-x}$ layer, the resultant diode will emit either yellow light or orange light. More specifically, when the arsenic concentration x in the second and the third layer is 0.15, the diode will emit yellow light, and when the arsenic concentration x is 0.25, it will emit orange light.

As shown also in FIG. 1, an electrode 20 is formed on the semiconductor layer 18. Generally a film of a gold-beryllium alloy, gold-zinc alloy or a similar gold alloy is used for the electrode 20.

On the other major surface 16 of the substrate 12 there is formed an electrode 22 made of a single layer of a gold-germanium alloy according to the invention. The gold-germanium alloy contains germanium in a concentration ranging from the upper limit at which germanium can form a solid solution with gold at room temperature to the upper limit at which germanium can form a solid solution with gold at the eutectic temperature of the alloy.

In order to see whether or not the above-mentioned gold-germanium alloy can make a satisfactory electrode on an N type gallium phosphide body, the inventors conducted the following experiment. First, gold-germanium alloy films of different germanium contents were formed 0.3 to 0.5 μm on N type gallium phosphide monocrystal bodies, respectively. The bodies had been prepared by LEC method and had a donor concentration of 1 to 10×10$^{17}$ cm$^{-3}$. Then, the bodies each now provided with a gold-germanium alloy film were heated at 500° C. for 10 minutes. Thereafter, the alloy film on each body was patterned into an electrode of a fine pattern. The contact resistance of each of the samples thus obtained was detected by a probe. The results are shown in FIG. 2, wherein o-marks denote good ohmic contacts, x-marks rectifying contacts, and Δ-marks contacts of the nature between the two. As FIG. 2 clearly shows, good ohmic contact is established between the gold-germanium alloy film and the N type gallium phosphide monocrystal substrate only when the germanium content in the alloy is 0.07 to 1.2% by weight. During the experiment it was observed that the gold-germanium alloy films having a germanium content of 1.2% by weight or less maintained their original shapes while heated at 500° C. but the gold-germanium alloy films having a germanium content of more than 1.2% by weight turned into lumps, the size of which was proportional to the germanium content.

Figure 3:
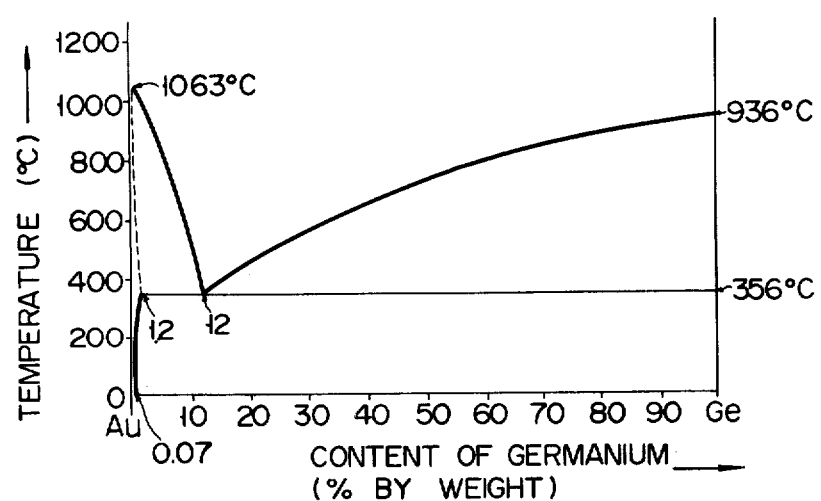
FIG. 3 is the phase diagram of a gold-germanium alloy.

FIG. 3 shows the phase diagram of gold-germanium alloys which teaches that the maximum germanium concentration at which germanium can form a solid solution with gold at the eutectic temperature of 356° C. is 1.2% by weight, while the maximum germanium concentration at which germanium can form a solid solution with gold at room temperature is 0.07% by weight. These figures coincide with the upper and lower limits of germanium content in the gold-germanium alloys which establish ohmic contact with the N type gallum phosphide substrates as obtained from the above-mentioned experiment. Further, FIG. 3 teaches that gold-germanium alloy containing less than 0.07% by weight of germanium remains a solid solution while heated. FIG. 3 also shows that gold-germanium alloy containing 0.07 to 1.2% by weight of germanium remains a solid solution while heated and becomes, when cooled to room temperature, a solid solution having a germanium content of 0.07% by weight and pure germanium, which has no eutectic structure. FIG. 3 further indicates that gold-germanium alloy containing more than 1.2% by weight of germanium comprises, while heated gradually, a solid solution containing 1.2% by weight of germanium and pure germanium within an eutectic structure and becomes, when cooled to room temperature, a solid solution containing 0.07% by weight of germanium and pure germanium with eutectic structure.

The experimental data shown in FIG. 2 and the teaching of FIG. 3 show that a film of a gold-germanium alloy melts and forms tiny lumps during the heat treatment if an eutectic structure exists in the gold-germanium alloy. It is well supposed that when a gold-germanium alloy is an eutectic one, gold and germanium diffuse into each other more rapidly than into gallium phosphide, whereby the film made of this alloy turns into tiny lumps. As a result, gold and germanium fail to diffuse into gallium phosphide in an amount enough to form ohmic contact with the gallium phosphide body.

A film of a gold-germanium alloy containing less than 1.2% by weight of germanium does not turn into lumps during the heat treatment because no eutectic structure is formed in it. However, such a gold-germanium alloy should have a germanium content larger than a specific value which is necessary to form ohmic contact with a gallium phosphide substrate. The very lower limit of germanium content is supposed to be 0.07% by weight. In view of this, the pure germanium existing in the solid solution specific to gold-germanium alloy containing 0.07 to 1.2% by weight of germanium can be a decisive factor for establishing ohmic contact between a film of the alloy and a substrate of gallium phosphide. If this is correct, it may be possible to analyze ohmic contact mechanism which is so complicated that no one has ever successfully analyzed.

Based on the results of the experiment and the teaching of FIG. 3, in this invention the germanium content of a gold-germanium alloy to be laid on an N type gallium phosphide substrate is set to range from 0.07 to 1.2% by weight. In other words, the germanium content corresponds to a germanium concentration ranging from the upper limit at which germanium can form a solid solution with gold at room temperature to the upper limit at which germanium can form a solid solution with gold at the eutectic temperature of the alloy. Any gold-germanium alloy film whose germanium content falls within this range establishes an equally good ohmic contact with an N type gallium phosphide body and remains in the form of a film during a heat treatment.

Further, the semiconductor layer 18 may be a P type layer formed in the monocrystal body 12. In this case, an electrode formed of an alloy of this invention and on the monocrystal body 12 and an electrode on the P type semiconductor layer are forme on the same plane including the monocrystal surface.

The gold-germanium alloy film according to the invention can be formed on the N type gallium phosphide body 12 by the known vacuum vapor deposition. Since gold vapor pressure is substantially equal to germanium vapor pressure, the composition of the vapor source is substantially the same as that of the film to be vapor-deposited on the body 12. This facilitates the vacuum vapor deposition. Moreover, neither gold nor germanium reacts with a tungsten boat usually employed as a receptacle for the vapor source. The tungsten boat can thus be used repeatedly. For this reason, the alloy according to this invention can be deposited in an easy manner.

The body 12 now provided with the gold-germanium alloy film is heated at 470° C. to 580° C. or more for about 3 to 10 minutes in an inert gas flow with no turbulence, for example argon gas flowing at 10 ml/cm$^2$.sec., thereby establishing ohmic contact between the film and the body 12. Thereafter the film is finely pattened into an electrode 22. The gold-germanium alloy according to this invention can be easily formed into a fine pattern.

The gold-germanium alloy according to this invention is further advantageous. A film made of it does not make the interface between it and the monocrystal body black, unlike a film made of the conventionally used gold-silicon alloy. Thus, if the device of this invention is a light emitting diode, the light emitting efficiency is improved by 10% or more as compared with a diode having a conventional metal electrode. Moreover, since the gold-germanium alloy film constituting the electrode 22 is comprised of a single layer, germanium is uniformly distributed in the alloy film.

This invention will be more fully understood from the following examples.

EXAMPLE 1

An N type tellurium-doped gallium phosphide layer 40 μm thick having an impurity concentration of $4.0 \times 10^{17}$ cm$^{-3}$ was formed by liquid-phase epitaxial growth method on an N type sulfur-doped gallium phosphide crystal substrate formed by LEC method and having an impurity concentration of $2.0 \times 10^{17}$ cm$^{-3}$. On the N type gallium phosphide layer there was formed by liquid-phase epitaxial growth method a P type gallium phosphide layer 40 μm thick doped with zinc and oxygen and having an impurity concentration of $2.0 \times 10^{17}$ cm$^{-3}$. Then, a film of the gold-germanium alloy according to this invention was deposited 0.5 μm thick on the N type gallium phosphide substrate. On the P type gallium phosphide layer an electrode of a gold-zinc alloy was formed. After subjection to a heat treatment, the gold-germanium film and the gold-zinc film were patterned into electrodes. In this way a red light emitting diode was manufactured. This diode exhibited a light emitting efficiency of 8% at minimum and 12% at maximum.

EXAMPLE 2

An N type gallium phosphide crystal substrate formed by LEC method and having an impurity concentration of $3 \times 10^{17}$ cm$^{-3}$ was heated and contacted with gallium solution to have its surface melted and then was cooled to have its surface solidified again, thereby forming a regrown N type layer 30 μm thick having am impurity concentration of $1.5 \times 10^{17}$ cm$^{-3}$. On the regrown N type layer there was formed by liquid-phase epitaxial growth method a P type gallium phosphide layer 20 μm thick having an impurity concentration of $1 \times 10^{18}$ cm$^{-3}$. On the surfaces of the substrate and the P type layer electrodes made of the gold-germanium alloy and goldzinc alloy were formed in the same manner as in Example 1. In this way a green light emitting diode was manufactured, which exhibited a light emitting efficiency of 0.2%.

EXAMPLE 3

On an N type gallium phosphide crystal substrate formed by LEC method and having an impurity concentration of $3 \times 10^{17}$ cm$^{-3}$, a first gallium arsenide phosphide layer having an arsenic concentration profile of 0 to x from the substrate toward its surface was formed by vapor-phase epitaxial growth method based on the reaction between gallium chloride (GaCl$_3$), arsine (AsH$_3$) and phosphine (PH$_3$). On the first layer there was formed by a similar vapor-phase growth method a second gallium arsenide phosphide (ga As$_x$ P$_{1-x}$) layer 30 to 50 μm thick. Then, on the second layer there was formed also by vapor-phase growth method a third gallium arsenide phosphide (Ga As$_x$ P$_{1-x}$) layer 10 to 15 μm thick, doped with nitrogen. In the third layer, zinc was diffused to form a P type gallium arsenide phosphide layer 5 to 8 μm thick. In this way two samples were made. In one sample the second and the third layer had an arsenic concentration of 15% (i.e., x=0.15). In the other sample the second and the third layer had an arsenic concentration of 25% (i.e., x=0.25). On both samples a pair of electrodes made of the gold-germanium alloy and gold-zinc alloy were formed in the same manner as in Example 1. The sample, wherein the third layer had an arsenic concentration of 15%, emitted yellow light, while the sample, wherein the third layer had an arsenic concentration of 25%, emitted orange light. The light emitting efficiency of both samples ranged from 0.15% to 0.25%.

What we claim is:

1. A gallium phosphide semiconductor device comprising:
   an N type gallium phosphide monocrystal;
   a semiconductor layer formed in or on the monocrystal; and
   a pair of electrodes forming an ohmic contact, formed on a surface of the monocrystal and on a surface of the semiconductor layer, said electrode on the monocrystal surface being made of a film of a gold-germanium alloy containing germanium in a concentration ranging from the upper limit at which germanium forms a solid solution with gold at room temperature to the upper limit at which germanium forms a solid solution with gold at the eutectic temperature of the alloy.

2. A semiconductor device according to claim 1, wherein said gold-germanium alloy contains 0.07 to 1.2% by weight of germanium.

3. A semiconductor device according to claim 1, wherein said gold-germanium alloy film is comprised of a single layer in which germanium is distributed uniformly.

4. A semiconductor device according to claim 3, wherein said gold-germanium alloy film is formed by vacuum deposition method and then heat-treated at 470° C. or more.

5. A semiconductor device according to any of claims 1 to 4, wherein said semiconductor layer is formed on one surface of the monocrystal and the electrode of said alloy film is formed on the other surface of the monocrystal.

6. A semiconductor device according to claim 5, wherein said semiconductor layer is comprised of two layers, one of which is an N type gallium phosphide layer formed on said one surface of the monocrystal and the other of which is a P type gallium phosphide layer formed on the N type layer.

7. A semiconductor device according to claim 5, wherein said semiconductor layer is formed of gallium arsenide phosphide.

8. A semiconductor device according to claim 7, wherein said gallium arsenide phosphide layer is comprised of a first vapor-phase epitaxially grown layer of gallium arsenide phosphide formed on said one surface of the monocrystal and having a rising gradient of an arsenic concentration from the monocrystal surface toward its surface, a second vapor-phase epitaxially grown layer of gallium arsenide phosphide formed on said first layer, a third vapor-phase epitaxially grown layer of gallium arsenide phosphide formed on said second layer and doped with nitrogen, and a fourth layer of gallium arsenide phosphide formed by diffusing zinc into said third layer.

9. A semiconductor device according to any of claims 1 to 4, wherein said semiconductor layer is a P type layer formed in said monocrystal and said pair of electrodes are formed on the same plane including a surface of the monocrystal.

10. A semiconductor device according to claim 1, wherein the electrode on said semiconductor layer is made of gold-zinc alloy or gold-bellyrium alloy.

* * * * *